(12) United States Patent
Camillo-Castillo et al.

(10) Patent No.: US 9,219,128 B2
(45) Date of Patent: Dec. 22, 2015

(54) METHODS OF FABRICATING BIPOLAR JUNCTION TRANSISTORS WITH REDUCED EPITAXIAL BASE FACETS EFFECT FOR LOW PARASITIC COLLECTOR-BASE CAPACITANCE

(71) Applicant: GLOBALFOUNDRIES INC., Grand Cayman (KY)

(72) Inventors: Renata Camillo-Castillo, Essex Junction, VT (US); David L. Harame, Essex Junction, VT (US); Vibhor Jain, Essex Junction, VT (US); Vikas K. Kaushal, Essex Junction, VT (US); Marwan H. Khater, Astoria, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 197 days.

(21) Appl. No.: 13/800,091

(22) Filed: Mar. 13, 2013

(65) Prior Publication Data

US 2014/0264341 A1    Sep. 18, 2014

(51) Int. Cl.
*H01L 29/73*     (2006.01)
*H01L 29/66*     (2006.01)
*H01L 21/8249*   (2006.01)
*H01L 29/732*    (2006.01)
*H01L 29/737*    (2006.01)
*H01L 29/08*     (2006.01)
*H01L 29/10*     (2006.01)
*H01L 21/762*    (2006.01)

(52) U.S. Cl.
CPC ...... *H01L 29/66242* (2013.01); *H01L 21/7624* (2013.01); *H01L 21/8249* (2013.01); *H01L 29/0826* (2013.01); *H01L 29/1004* (2013.01); *H01L 29/66287* (2013.01); *H01L 29/7325* (2013.01); *H01L 29/7371* (2013.01); *H01L 2924/1305* (2013.01)

(58) Field of Classification Search
CPC ................. H01L 29/66242; H01L 2924/1305; H01L 21/8249; H01L 29/1004; H01L 29/0821
USPC .......................... 438/235, 309, 312; 257/197
See application file for complete search history.

(56) References Cited

U.S. PATENT DOCUMENTS

| | | | |
|---|---|---|---|
| 5,523,245 A | 6/1996 | Imai | |
| 6,465,870 B2 | 10/2002 | Voldman | |
| 6,479,380 B2 | 11/2002 | Furusawa et al. | |
| 6,555,874 B1 | 4/2003 | Hsu et al. | |
| 6,599,830 B2 | 7/2003 | Furusawa et al. | |
| 6,674,102 B2 | 1/2004 | Coolbaugh et al. | |
| 6,974,977 B2 | 12/2005 | Washio et al. | |

(Continued)

FOREIGN PATENT DOCUMENTS

CN        102034706 A        4/2011

*Primary Examiner* — Howard Weiss
*Assistant Examiner* — Tifney Skyles
(74) *Attorney, Agent, or Firm* — Thompson Hine LLP; Anthony Canale

(57) ABSTRACT

Fabrication methods, device structures, and design structures for a bipolar junction transistor. A dielectric structure is formed that is coextensive with a single crystal semiconductor material of a substrate in an active device region. A semiconductor layer is formed that includes a single crystal section coupled with the active device region. The semiconductor layer has an edge that overlaps with a top surface of the dielectric structure. An intrinsic base layer is formed on the semiconductor layer.

16 Claims, 10 Drawing Sheets

(56) References Cited

U.S. PATENT DOCUMENTS

| | | | |
|---|---|---|---|
| 7,087,940 B2 * | 8/2006 | Khater et al. | ................. 257/197 |
| 7,462,923 B1 | 12/2008 | U'Ren | |
| 7,521,734 B2 | 4/2009 | Oue et al. | |
| 2007/0278621 A1 | 12/2007 | Rucker et al. | |
| 2009/0283801 A1 * | 11/2009 | Pagette et al. | ................. 257/190 |
| 2012/0112244 A1 | 5/2012 | Camillo-Castillo et al. | |

* cited by examiner

US 9,219,128 B2

METHODS OF FABRICATING BIPOLAR JUNCTION TRANSISTORS WITH REDUCED EPITAXIAL BASE FACETS EFFECT FOR LOW PARASITIC COLLECTOR-BASE CAPACITANCE

BACKGROUND

The invention relates generally to semiconductor device fabrication and, in particular, to bipolar junction transistors, fabrication methods for bipolar junction transistors, and design structures for a bipolar junction transistor.

Bipolar junction transistors are typically found in demanding types of integrated circuits, especially integrated circuits destined for high-frequency and high-power applications. One specific application for bipolar junction transistors is in radiofrequency integrated circuits (RFICs), which are found in wireless communications systems, power amplifiers in cellular telephones, and other varieties of high-speed integrated circuits. Bipolar junction transistors may also be combined with complementary metal-oxide-semiconductor (CMOS) field effect transistors in bipolar complementary metal-oxide-semiconductor (BiCMOS) integrated circuits, which take advantage of the positive characteristics of both transistor types in the construction of the integrated circuit.

Conventional bipolar junction transistors constitute three-terminal electronic devices constituted by three semiconductor regions, namely an emitter, a base, and a collector. An NPN bipolar junction transistor includes two regions of n-type semiconductor material constituting the emitter and collector, and a region of p-type semiconductor material sandwiched between the two regions of n-type semiconductor material to constitute the base. A PNP bipolar junction transistor has two regions of p-type semiconductor material constituting the emitter and collector, and a region of n-type semiconductor material sandwiched between two regions of p-type semiconductor material to constitute the base. Generally, the differing conductivity types of the emitter, base, and collector form a pair of p-n junctions, namely a collector-base junction and an emitter-base junction. A voltage applied across the emitter-base junction of a bipolar junction transistor controls the movement of charge carriers that produce charge flow between the collector and emitter regions of the bipolar junction transistor.

Improved device structures, fabrication methods, and design structures are needed that enhance the device performance of bipolar junction transistors.

BRIEF SUMMARY

In an embodiment of the invention, a method is provided for fabricating a bipolar junction transistor. The method includes forming a dielectric structure that is coextensive with a single crystal semiconductor material of a substrate in an active device region and forming a semiconductor layer that includes a single crystal section coupled with the active device region. The semiconductor layer has an edge that overlaps with a top surface of the dielectric structure. The method further includes, after the semiconductor layer is formed, forming an intrinsic base layer on the semiconductor layer.

In an embodiment of the invention, a device structure is provided for a bipolar junction transistor formed using a substrate comprised of single crystal semiconductor material. The device structure includes an active device region in the substrate, a dielectric structure positioned coextensive with the active device region, a semiconductor layer including a single crystal section coupled with the active device region, and an intrinsic base layer on the semiconductor layer. The active device region is comprised of the single crystal semiconductor material of the substrate, and the single crystal section of the semiconductor layer has an edge that overlaps with a top surface of the dielectric structure.

In an embodiment of the invention, a hardware description language (HDL) design structure is encoded on a machine-readable data storage medium. The HDL design structure comprises elements that, when processed in a computer-aided design system, generate a machine-executable representation of a device structure for a bipolar junction transistor. The HDL design structure includes an active device region in a substrate, a dielectric structure positioned coextensive with the active device region, a semiconductor layer including a single crystal section coupled with the active device region, and an intrinsic base layer on the semiconductor layer. The active device region is comprised of a single crystal semiconductor material comprising the substrate, and the single crystal section of the semiconductor layer has an edge that overlaps with a top surface of the dielectric structure. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
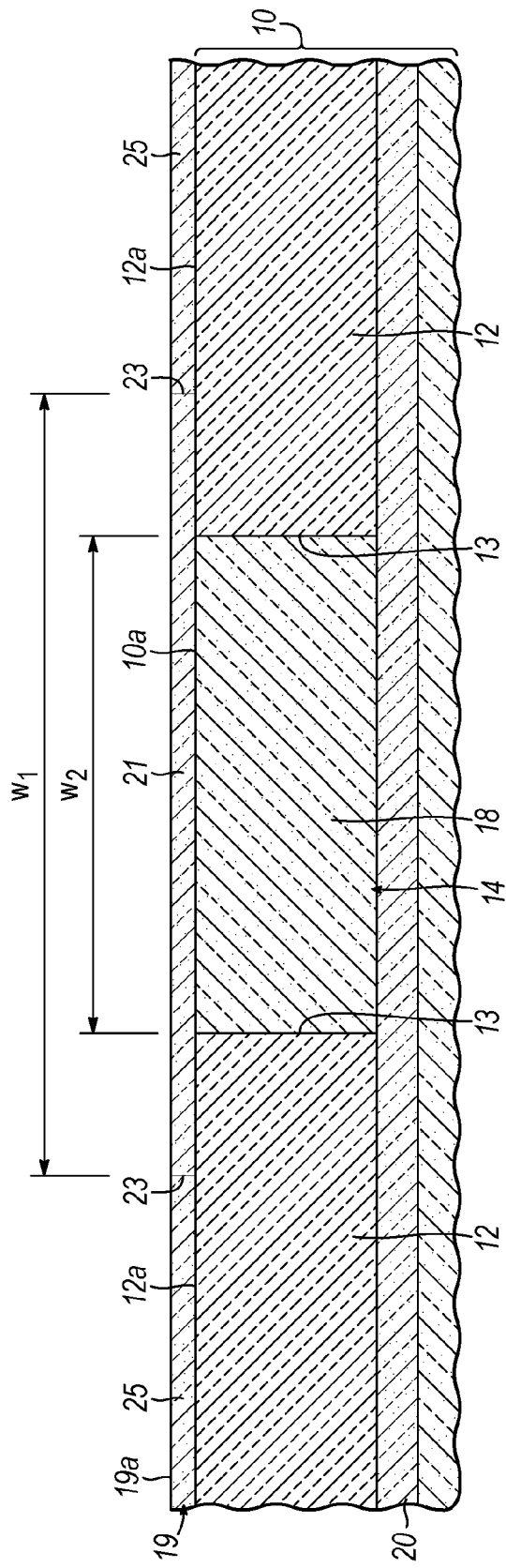
FIGS. 1-3 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 may be any suitable bulk substrate comprising a single crystal semiconductor material that a person having ordinary skill in the art would recognize as suitable for forming an integrated circuit. For example, substrate 10 may be comprised of a wafer of a monocrystalline silicon-containing material, such as single crystal silicon with a (100) crystal lattice orientation. The semiconductor material comprising substrate 10 may be lightly doped with an impurity to alter its electrical properties and may also include an optional epitaxial layer. The top surface of the active device region 14 is coextensive with a top surface 10a of the substrate 10.

Figure 3:
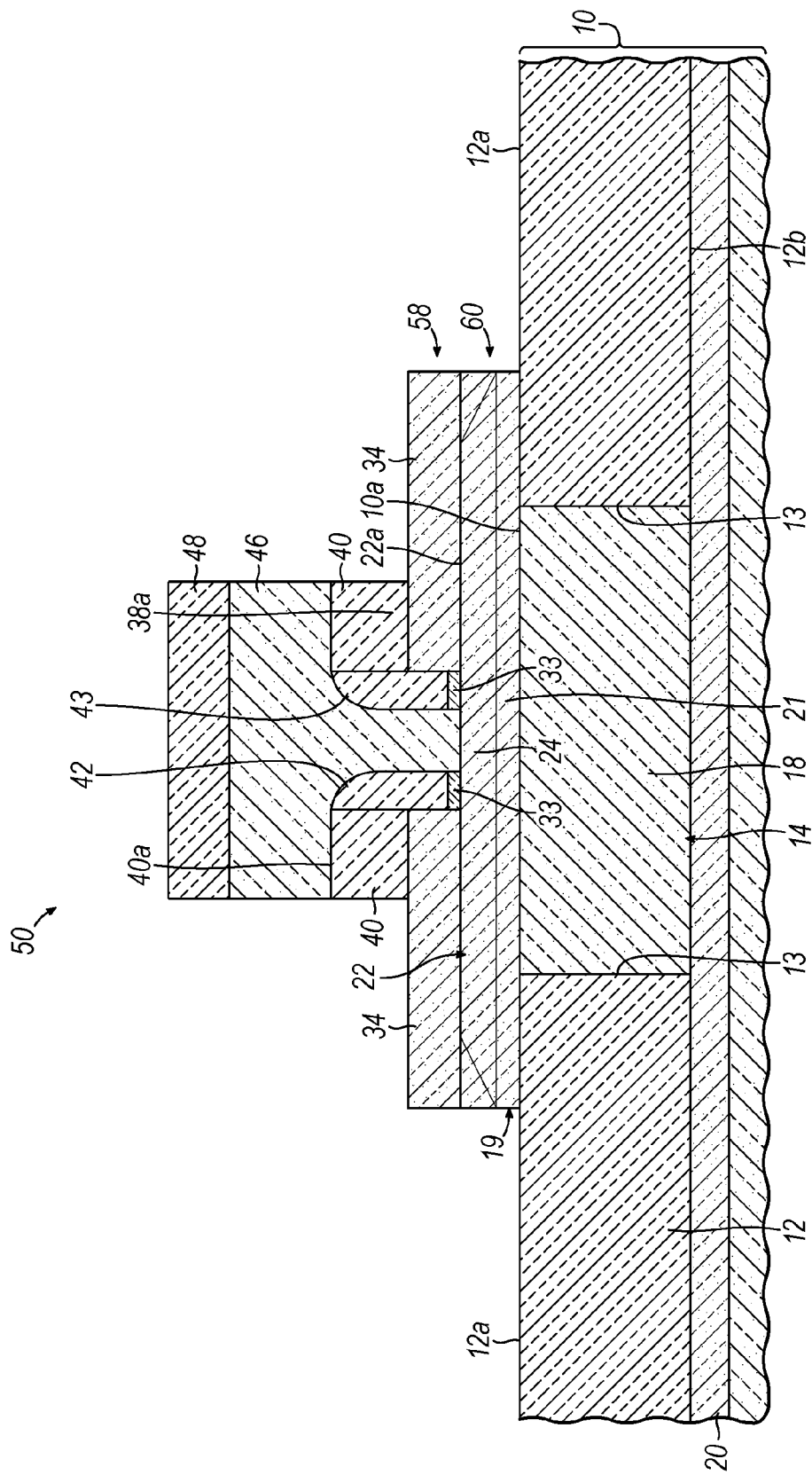

Trench isolation regions 12 are formed that circumscribe and electrically isolate the active device region 14 of the substrate 10, which is used in the fabrication of a bipolar junction transistor 50 (FIG. 3). The trench isolation regions 12 may be isolation regions formed by a shallow trench isolation (STI) technique that relies on a lithography and dry etching process to define trenches in substrate 10, deposits an electrical insulator to fill the trenches, and planarizes the electrical insulator relative to the top surface 10a of the substrate 10 using a chemical mechanical polishing (CMP) process. The electrical insulator may be comprised of an oxide of silicon, such as tetraethylorthosilicate (TEOS) deposited by chemical vapor deposition (CVD). A top surface 12a of the trench isolation regions 12 is nominally coplanar with the top surface 10a of the substrate 10.

A collector 18 is formed in the active device region 14 of the substrate 10 and a subcollector 20 is formed in the substrate 10 as impurity-doped regions of the same conductivity type. A top surface of the collector 18 may be coextensive with the top surface 10a of substrate 10 in the active device region 14. Sidewalls 13 define a boundary that encircles or surrounds the active device region 14 of substrate 10. More specifically, the sidewalls 13 represent interior surfaces of the trench isolation regions 12 that are coextensive with the active device region 14 of substrate 10. The top surface 12a of the trench isolation regions 12 is nominally coplanar with the top surface 10a of substrate 10 in the active device region 14.

The collector 18 and subcollector 20 may be formed by introducing an electrically-active dopant, such as an impurity species from Group V of the Periodic Table (e.g., phosphorus (P), arsenic (As), or antimony (Sb)) effective to impart n-type conductivity in the host semiconductor material. In one embodiment, the collector 18 and the subcollector 20 may be formed by separate ion implantations of n-type impurity species and, thereafter, annealing to electrically activate the impurity species and to alleviate implantation damage. The subcollector 20 may be formed by a high-current ion implantation followed by a lengthy, high temperature thermal anneal that dopes a thickness of the substrate 10 before the optional epitaxial layer is formed. The collector 18 may comprise a selectively implanted collector (SIC) formed by ion implantation in the central part of the active device region 14 at an appropriate stage of the process flow. During stages of the process flow subsequent to implantation, the dopant in the collector 18 may diffuse laterally and vertically such that substantially the entire central portion of active device region 14 becomes impurity doped and, as a result, is structurally and electrically continuous with the subcollector 20.

The top surface 10a of substrate 10 in the active device region 14 may be cleaned to, for example, remove native oxide. The cleaning process may be a wet chemical etching process using either dilute hydrofluoric (DHF) or buffered hydrofluoric (BHF), or a dry process, such as chemical oxide removal (COR).

A blanket layer 19 comprised of a semiconductor material is deposited on the cleaned top surface 10a of the substrate 10 in the active device region 14, as well as on a top surface 12a of the trench isolation regions 12. The semiconductor material in layer 19 may be comprised of a non-single crystal semiconductor material, such as polycrystalline semiconductor material or amorphous semiconductor material. In one embodiment, the semiconductor material in layer 19 may be comprised of polycrystalline silicon deposited using rapid thermal chemical vapor deposition (RTCVD) of polysilicon from silane ($SiH_4$). In another embodiment, the semiconductor material in layer 19 may be comprised of amorphous silicon deposited using plasma-enhanced chemical vapor deposition (PECVD) or low-pressure chemical vapor deposition (LPCVD). The semiconductor material in layer 19 may alternatively comprise silicon-germanium (SiGe) including silicon (Si) and germanium (Ge) in an alloy, which may be undoped, may comprise an n-type dopant, or may comprise a p-type dopant.

A thermal anneal is used to realign, e.g., regrow or crystallize, the semiconductor material of layer 19 to form a single crystal section 21 having an epitaxial relationship with the semiconductor material of the substrate 10 in the active device region 14. In the alignment process, the single crystal section 21 acquires the crystal structure and orientation of the single crystal semiconductor material of substrate 10 in the active device region 14, which is in direct contact with the top surface 10a of the substrate 10. The single crystal semiconductor material of the substrate 10 in the active device region 14 operates as a growth seed for crystalline realignment of the layer 19 resulting in the formation of the single crystal section 21. The thermal anneal may occur in an inert gas atmosphere and with conditions (e.g., time, temperature) sufficient to provide the single crystal section 21 with designated dimensions. Exemplary thermal annealing conditions may be a two-hour anneal at 600° C. or a fifteen-minute anneal at 900° C. with lower temperatures requiring longer time to provide the same lateral extent of realignment.

The thermal anneal conditions are controlled such that the realigned single crystal section 21 covers the top surface 10a of the substrate 10 in the active device region 14 and partially covers the top surface 12a of trench isolation regions 12. Specifically, the lateral dimension of the single crystal section 21 extends past the sidewall 13 representing the boundary between each trench isolation region 12 and the active device region 14, and a portion of the single crystal section 21 overlies each trench isolation region 12. The layer 19 transitions at an edge 23 from the single crystal section 21 to non-single crystal sections 25 of layer 19 in the field. The edge 23, which overlies the trench isolation regions 12, denotes the perimeter of the single crystal section 21 and defines an interface between the section 21 and each section 25 of layer 19.

The single crystal section 21 has a width, $w_1$, measured relative to edge 23 that is wider than a width, $w_2$, of the active device region 14 and, hence, the collector 18. Similarly, the single crystal section 21 is larger than the active device region 14 in a length direction not visible in FIG. 1. The dimensions (length and width) of the single crystal section 21 are larger than the underlying area (length and width) of the active device region 14 and, hence, the area of the collector 18 when viewed from a perspective normal to surface 10a. The dimensional difference (e.g., the difference in the widths and lengths) defines the extent of the overlap of the single crystal section 21 of layer 19 with the top surface 12a of trench isolation regions 12.

Figure 2:
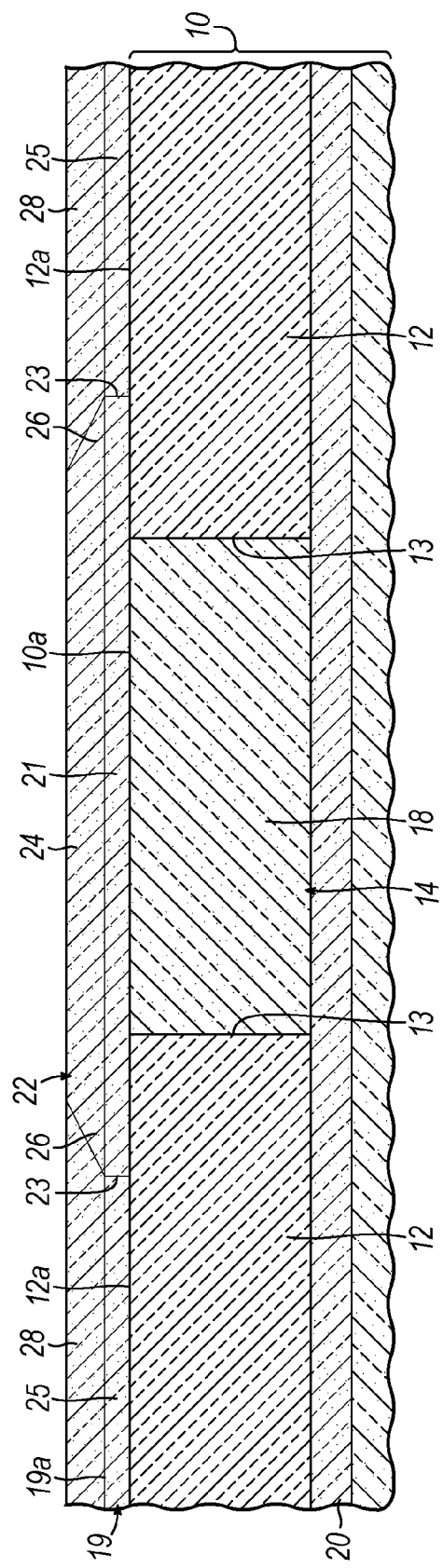

With reference to FIG. 2 in which like reference numerals refer to like features in FIG. 1 and at a subsequent fabrication stage of the processing method, an intrinsic base layer 22, which is comprised of a material suitable for forming an intrinsic base of the bipolar junction transistor 50 (FIG. 3), is formed as a continuous additive layer on layer 19. The intrinsic base layer 22 includes a single crystal section 24 positioned in vertical alignment with the single crystal section 21 of layer 19. The intrinsic base layer 22 further includes facets 26 that terminate at a location nominally coinciding with (i.e., coterminous with) the location of the edge 23 between the single crystal section 21 and sections 25 in layer 19. In the representative embodiment, the facets 26 surround the section 24. The single crystal section 24 of intrinsic base layer 22 is coupled by the single crystal section 21 of layer 19 with the collector 18 and directly contacts layer 19.

The intrinsic base layer 22 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 22 may be uniform or the germanium content of intrinsic base layer 22 may be graded and/or stepped across the thickness of intrinsic base layer 22. If the germanium content is stepped, a thickness of the intrinsic base layer 22, such as a thickness directly contacting the collector 18, may not contain any germanium and may be entirely comprised of silicon (Si). The intrinsic base layer 22 may be doped with one or more impurity species, such as boron or phosphorus either with or without carbon.

Intrinsic base layer 22 may be formed using a low temperature epitaxial (LTE) growth process, such as vapor phase epitaxy (VPE) that may be conducted at a growth temperature ranging from 400° C. to 850° C. Single crystal semiconductor material (e.g., single crystal silicon and/or single crystal SiGe) epitaxially grows or deposits in single crystal layer 24 on the single crystal section 21 of layer 19. The crystal structure of single crystal semiconductor material of the single crystal section 21 serves as a crystalline template for the growth of the crystal structure of the single crystal section 24 of intrinsic base layer 22. Proximate to the facets 26, intrinsic base layer 22 may be a mixture of polycrystalline and single crystal semiconductor material. The intrinsic base layer 22 transitions at the facets 26 to discontinuous and non-uniform polycrystalline semiconductor material comprising sections 28. In an alternative, embodiment, the intrinsic base layer 22 may be grown using a selective epitaxial growth (SEG) process such that only the single crystal section 21 and facets 26 are formed and layer 22 terminates at the edge 23.

The dimensions (length and width) of the single crystal section 24 and facets 26 of intrinsic base layer 22, collectively, in the plane of the top surface 22a are nominally equal to the dimensions (length and width) of the single crystal section 21 of layer 19. The lateral location of edge 23 at the transition from the single crystal section 21 to the sections 25 of layer 19 determines the location of the facets 26 and the extent of overlap with the top surface 12a of the trench isolation regions 12. By placing the edge 23 of layer 19 over the trench isolation regions 12 and exterior of the sidewalls 13, the facets 26 can be laterally positioned outside of the area of the active device region 14.

Figure 2A:
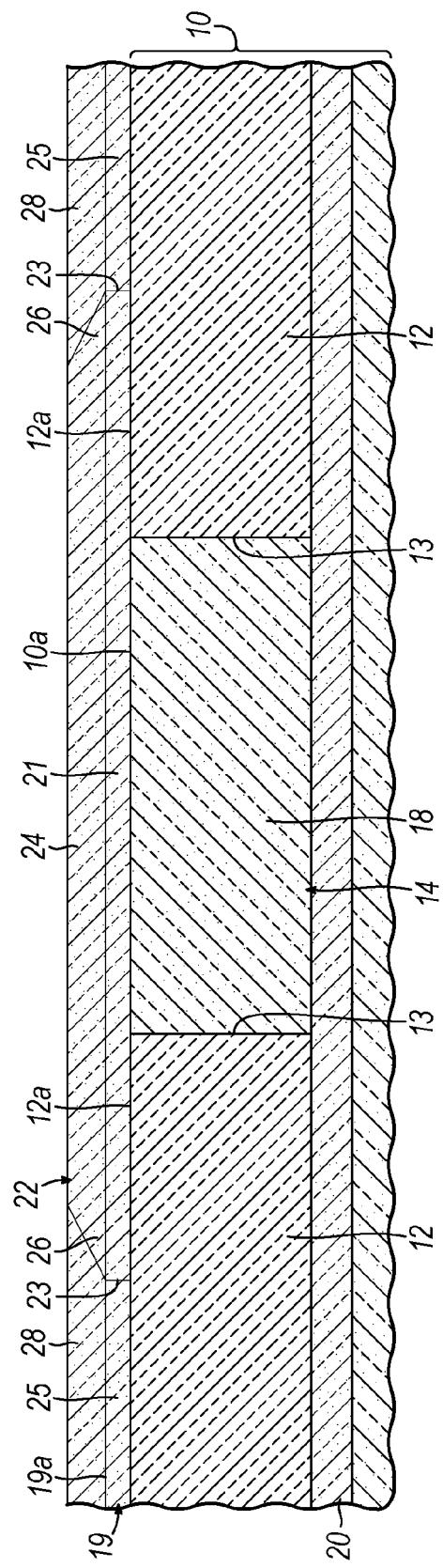
FIG. 2A is a cross-sectional view similar to FIG. 2 in accordance with an alternative embodiment of the invention.

The location of the edge 23 may be extended laterally by an additional or extended anneal of layer 19 before the single crystal section 24 is formed. In particular, a low temperature anneal may be used to extend the single crystal section 21 further outwardly in a lateral direction across the trench isolation regions 12, as shown in FIG. 2A. The single crystal section 21 operates as a growth seed for the single crystal semiconductor material that is added in the enlargement. Representative thermal anneal conditions for enlarging the single crystal region 21 are 600° C. to 650° C. for 30 minutes or 900° C. for 2 minutes in an inert atmosphere. The enlargement of the single crystal section 21 of layer 19 permits a commensurate enlargement of the single crystal section 24 of the intrinsic base layer 22 and shifts the facets 26 further outward from the active device region 14 relative to the sidewalls 13 to increase the overlap with the top surface 12a of the trench isolation regions 12.

With reference to FIG. 3 in which like reference numerals refer to like features in FIG. 2 and at a subsequent fabrication stage of the processing method, a dielectric layer 33 is applied and patterned to leave a pad at the intended location of an emitter. An extrinsic base layer 34 is formed on the top surface 22a of the intrinsic base layer 22. In one embodiment, the extrinsic base layer 34 may be comprised of polycrystalline semiconductor material (e.g., polysilicon or polycrystalline SiGe) deposited by CVD process. If the extrinsic base layer 34 is comprised of SiGe, the concentration of Ge may have a graded or an abrupt profile and may include additional layers, such as a Si cap layer and/or a Si bottom layer. The extrinsic base layer 34 may be in situ doped with a concentration of a dopant, such as an impurity species from Group III of the Periodic Table (e.g., boron) effective to impart p-type conductivity and may be optionally doped with carbon. As a consequence of the crystalline state of the single crystal section 24 of intrinsic base layer 22, the extrinsic base layer 34 may be comprised of single crystal semiconductor material that relies on the semiconductor material of the intrinsic base layer 22 as a growth seed.

A dielectric layer 40 is then formed on the extrinsic base layer 34. Dielectric layer 40, which is formed on a top surface 34a of extrinsic base layer 34. Dielectric layer 40 may be comprised of an electrical insulator such as silicon nitride ($Si_3N_4$) deposited using CVD.

Dielectric layer 40 is patterned using photolithography and etching processes to define an emitter opening aligned with the collector 18. To that end, a patterned etch mask (not shown) is applied to the dielectric layer 40. In one embodiment, the etch mask may be a photoresist layer comprised of a sacrificial organic material applied by spin coating to dielectric layer 40. The photolithography process that patterns the photoresist layer exposes the photoresist to radiation imaged through a photomask and develops the resulting latent feature pattern in the exposed photoresist to define a window at the intended location for the emitter opening. The etching process relies on an etch chemistry effective to remove the material of the dielectric layer 40 exposed within the window and stops on the extrinsic base layer 34. After the window is formed, the etch mask is removed. If comprised of photoresist, the etch mask may be removed by oxygen plasma ashing or chemical stripping.

The opening is extended by a controlled etching process, such as RIE, through the thickness of the extrinsic base layer 34 using the patterned dielectric layer 40 as a hardmask. Spacers 42, 43 are formed inside the emitter opening and extend vertically to the base of the emitter opening. The spacers 42, 43 may directly contact the top surface 22a of intrinsic base layer 22. The spacers 42, 43 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces.

The emitter opening is extended through the pad defined by dielectric layer 60 and an emitter 46 of the bipolar junction transistor 50 is formed in the emitter opening. The emitter 46 may be formed from a layer of semiconductor material that is deposited and then patterned using lithography and etching processes. The lithography process may utilize photoresist and photolithography to form an etch mask that protects only a strip of the semiconductor material registered with the emitter opening. An etching process that stops on the material of layer 40 is selected to fashion the emitter 46 from the protected strip of semiconductor material. The etch mask is subsequently removed.

The emitter 46 is electrically and physically coupled with the intrinsic base layer 22. The bottom part of the emitter 46 directly contacts the top surface 22a of intrinsic base layer 22. A head of the emitter 46 protrudes out of the emitter opening and includes lateral arms that overlap with the top surface of dielectric layer 40. A cap 48 of a dielectric material may be formed on the head of the emitter 46. The non-conductive spacers 42, 43 encircle or surround the emitter 46 so that the emitter 46 is electrically isolated from the extrinsic base layer 34.

The emitter 46 of the bipolar junction transistor 50 may be formed from a layer of a heavily-doped semiconductor material that is deposited and then patterned using lithography and etching processes. For example, the emitter 46 may be comprised of polysilicon or polycrystalline silicon-germanium deposited by CVD or LPCVD and heavily doped with a concentration of a dopant, such as an impurities species from Group V of the Periodic Table, such as phosphorus (P), arsenic (As), to impart n-type conductivity. The heavy-doping level reduces the resistivity of the polysilicon or polycrystalline silicon-germanium, and may be introduced by in situ doping that adds a dopant gas, such as phosphine or arsine, to the CVD reactant gases. The bipolar junction transistor 50 may be a heterojunction bipolar transistor (HBT) if at least two of the collector 18, emitter 46, and intrinsic base 60 are comprised of differing semiconductor materials.

Dielectric layer 40 is lithographically patterned using the same etch mask used to form the emitter 46, and an etching process, such as RIE, with suitable etch chemistries. The etch mask is subsequently removed. The extrinsic base layer 34 and intrinsic base layer 22 are then lithographically patterned with photolithography and etching processes and a different etch mask to respectively define an extrinsic base 58 and an intrinsic base 60 of the bipolar junction transistor 50.

After patterning, the bipolar junction transistor 50 has a vertical architecture in which the intrinsic base 60 is located between the emitter 46 and the collector 18, and the emitter 46, the intrinsic base 60, and the collector 18 are vertically arranged. The conductivity types of the semiconductor material constituting the emitter 46 and the semiconductor materials constituting extrinsic base 58 and intrinsic base 60 are opposite. One p-n junction is defined at the interface between the emitter 46 and the intrinsic base 60. Another p-n junction is defined at the interface between the collector 18 and the intrinsic base 60.

During the front-end-of-line (FEOL) portion of the fabrication process, the device structure of the bipolar junction transistor 50 is replicated across at least a portion of the surface area of the substrate 10. In BiCMOS integrated circuits, complementary metal-oxide-semiconductor (CMOS) transistors (not shown) may be formed using other regions of the substrate 10. As a result, both bipolar and CMOS transistors may be available on the same substrate 10.

Standard silicidation and standard back-end-of-line (BEOL) processing follows, which includes formation of contacts and wiring for the local interconnect structure, and formation of dielectric layers, via plugs, and wiring for an interconnect structure coupled by the interconnect wiring with the bipolar junction transistor 50, as well as other similar contacts for additional device structures like bipolar junction transistor 50 and CMOS transistors (not shown) included in other circuitry fabricated on the substrate 10. Other active and passive circuit elements, such as diodes, resistors, capacitors, varactors, and inductors, may be fabricated on substrate 10 and available for use in the BiCMOS integrated circuit.

Because the single crystal section 21 of layer 19 is larger than the area of the active device region 14, the facets 26 are displaced outwardly in a lateral direction away from the active device region 14. The facets 26, which are nominally coterminous with the edge 23 of the single crystal section 21 of layer 19, are instead located over the trench isolation regions 12. Consequently, the intrinsic base 60 lacks a faceted region in the device area defined by the boundary of the active device region 14, and the bipolar junction transistor 50 has a smoother topology, an improved process window, a lower base resistance, and a lower base-collector capacitance.

The lateral displacement of the facets 26 reduces the incorporation of dopant by diffusion from the extrinsic base layer 34 into the section of the intrinsic base 60 coextensive with the active device region 14 and, subsequently, into the active device region 14 underlying the intrinsic base 60. The reduction in dopant incorporation operates to improve device performance by reducing the parasitic collector-base capacitance (Ccb) of the bipolar junction transistor 50. The reduction in Ccb improves the performance of the bipolar junction transistor 50 by increasing figures of merit such as the cut-off frequency $f_T$ and the maximum oscillation frequency $f_{max}$. The lateral displacement of the facets 26 also reduces defects in the section of the intrinsic base 60 coextensive with the active device region 14, which may increase device yield and reliability.

Figure 4:
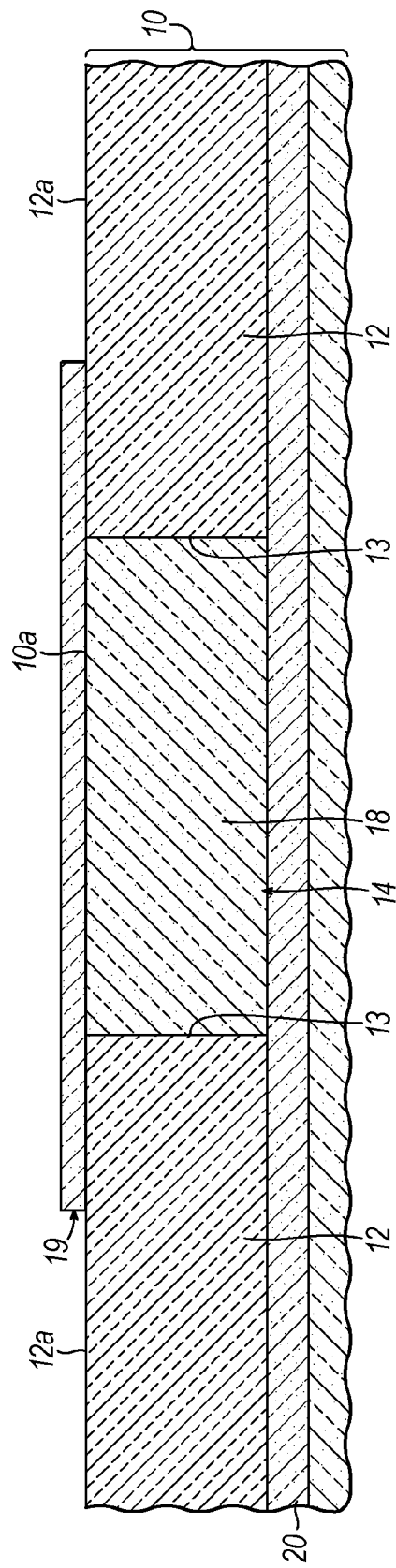
FIGS. 4 and 5 are cross-sectional views of a portion of a substrate at successive fabrication stages of a processing method for fabricating a device structure in accordance with an alternative embodiment of the invention.

With reference to FIG. 4 in which like reference numerals refer to like features in FIG. 1 and in accordance with an alternative embodiment, the blanket layer 19 may be lithographically patterned using a photolithography process and an etching process before realignment and before the intrinsic base layer 22 is applied. The patterning removes field sections of the layer 19 that are peripherally outside of the active device region 14, as apparent by the truncation of the layer 19 visible in FIG. 4. The patterning utilized in this embodiment of the invention may be utilized in other embodiments of the invention to eliminate field regions of layer 19 and, if layer 22 is formed by selective epitaxy, field regions of the intrinsic base layer 22.

To that end, a mask layer (not shown) may be applied on a top surface 19a of layer 19. The mask layer may comprise a photoresist that is applied as a layer by a spin coating process, pre-baked, exposed to a radiation projected through a photomask, baked after exposure, and developed with a chemical developer to form an etch mask that partially covers the layer 19. The pattern is transferred from the mask layer to layer 19. The etching process may comprise a wet etching process or a dry etching process, such as reactive-ion etching (RIE), having an appropriate etch chemistry. The mask layer is removed after patterning. If comprised of a photoresist, the mask layer may then be removed by ashing or solvent stripping, followed by a conventional cleaning process.

Figure 5:
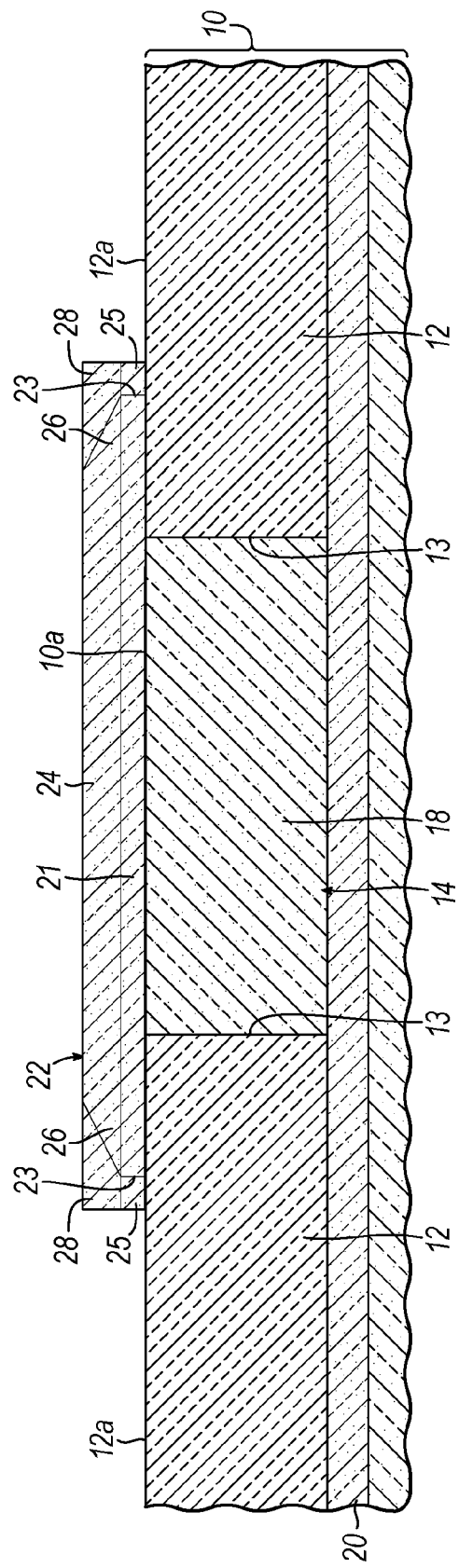

With reference to FIG. 5 in which like reference numerals refer to like features in FIG. 4 and at a subsequent fabrication stage of the processing method, a thermal anneal may be used to realign (i.e., regrow or recrystallize) the semiconductor material of layer 19 to form the single crystal section 21, which has an epitaxial relationship with the semiconductor material of the substrate 10 in the active device region 14. The intrinsic base layer 22 is then formed on the single crystal section 21 and includes a single crystal section 24, the facets 26 that are nominally coterminous with the edge 23 of layer 19, and the sections 28 that overly sections 25 of layer 19. The processes forming single crystal region 21 and intrinsic base layer 22 are described hereinabove in connection with FIGS. 1 and 2.

The sequence of the process flow then continues as described above with regard to FIG. 3 to produce the bipolar junction transistor 50.

Figure 6:
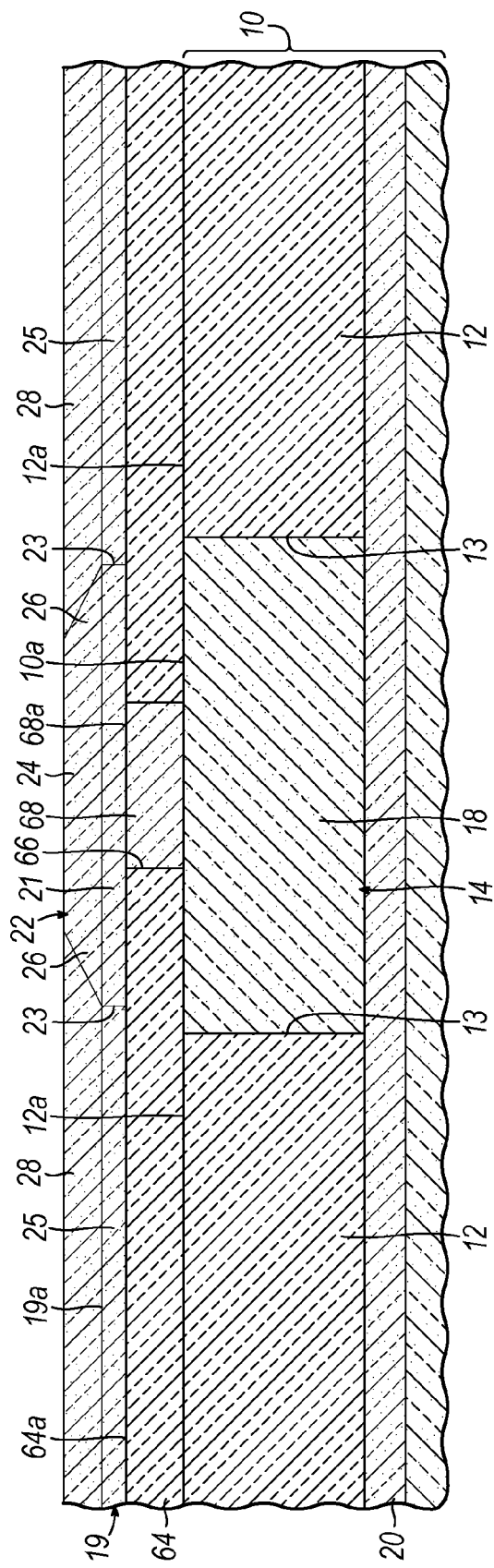
FIG. 6 is a cross-sectional view of a portion of a substrate at an initial fabrication stage of a processing method for fabricating a device structure in accordance with an alternative embodiment of the invention.

With reference to FIG. 6 in which like reference numerals refer to like features in FIG. 1 and in accordance with an alternative embodiment, a dielectric layer 64 may be deposited on top surface 10a of the substrate 10 and on the top surface 12a of the shallow trench isolation regions 12. The dielectric layer 64, which is a continuous blanket layer as deposited, is patterned to define a trench or opening 66 that opens to the top surface 10a of substrate 10 in the active device region 14 and that is aligned with the collector 18. In the representative embodiment, the opening 66 is aligned with the active device region 14 and collector 18. The dimensions (length and width) of the opening 66 assessed in the plane of the top surface 10a are smaller than the dimensions (length and width) of the top surface 10a of substrate 10 in the active device region 14.

To pattern the dielectric layer 64 and provide the opening 66, a mask layer (not shown) may be applied on a top surface of the dielectric layer 64. The mask layer may comprise a photoresist that is applied as a layer by a spin coating process, pre-baked, exposed to a radiation projected through a photomask, baked after exposure, and developed with a chemical developer to form an etch mask that includes an opening coinciding with the intended location of the opening 66. The pattern is transferred from the mask layer to dielectric layer 64. The etching process may comprise a wet etching process or a dry etching process, such as reactive-ion etching (RIE), having an appropriate etch chemistry. The mask layer is removed after the definition of opening 66. If comprised of a photoresist, the mask layer may then be removed by ashing or solvent stripping, followed by a cleaning process to remove any residual contamination.

A fill plug 68 comprised of a semiconductor material is formed in opening 66 by a selective epitaxial growth (SEG) process. In the representative embodiment, the fill plug 66 fully occupies the opening 66. The semiconductor material of substrate 10 in the active device region 14 operates as a seed crystal or crystalline seed that establishes a crystallographic pattern for the semiconductor material in fill plug 68 in which the crystallographic pattern of substrate 10 is reproduced so that fill plug 68 and the substrate 10 nominally have the same lattice structure and crystalline orientation. The SEG process may be conducted at a sub-atmospheric process pressure (e.g., 40 torr) and typically with the substrate 10 heated to a temperature between about 450° C. and about 1050° C.

The semiconductor material comprising the fill plug 68 may be silicon, silicon-germanium, or silicon-carbon, which may be doped to have a specific conductivity type such as the same conductivity type as the semiconductor material in the active device region 14. In one embodiment, the fill plug 68 may be in situ doped during growth with an impurity species from Group V of the Periodic Table (e.g., phosphorus (P) or arsenic (As)) so that the fill plug 68 has n-type conductivity. The top surface 12a of the trench isolation regions 12 is free of the semiconductor material constituting the fill plug 68 because the semiconductor material does not grow on dielectric material during the SEG process. The SEG process of this embodiment may be utilized in other embodiments of the invention to eliminate the field regions of intrinsic base layer 22.

A top surface 68a of the fill plug 68 may be nominally coplanar with a top surface 64a of the dielectric layer 64. The blanket layer 19 of semiconductor material is deposited on the top surface 68a of fill plug 68 and the top surface 64a of dielectric layer 64 surrounding the fill plug 68, and is annealed to define the single crystal section 21, as described above in connection with FIG. 1. During the thermal realignment process, the single crystal semiconductor material of the fill plug 68 functions as a growth seed for the single crystal section 21, which acquires the crystal structure and orientation of the fill plug 68. The intrinsic base layer 22 is formed, as described above in connection with FIG. 2, and extends laterally so that the facets 26 of the intrinsic base layer 22 nominally coincide with the edge 23 between the single crystal section 21 of layer 19 and sections 25 of layer 19.

Figure 7:
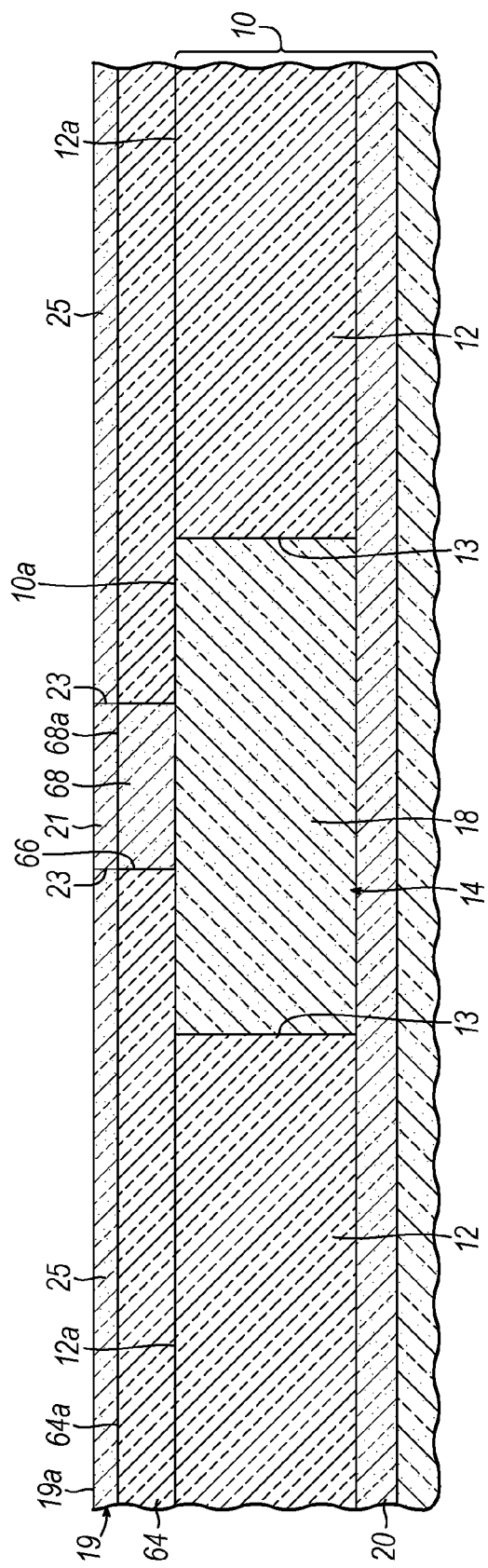
FIGS. 7 and 8 are cross-sectional views of a portion of a substrate at successive fabrication stages of a processing method for fabricating a device structure in accordance with an alternative embodiment of the invention.

With reference to FIG. 7 in which like reference numerals refer to like features in FIG. 6 and at a subsequent fabrication stage of the processing method, the dielectric layer 64 is patterned to form the opening 66 and then the fill plug 68 is formed in the trench by selective epitaxy. However, when the growth front for the fill plug 68 being grown by selective epitaxy reaches the mouth of the opening 66 proximate to the top surface 64a, the process conditions for the growth process are changed. The changed process conditions form the blanket layer 19 of polycrystalline semiconductor material on the top surface 64a of the dielectric layer 64 and continue to form the epitaxial semiconductor material to define the single crystal section 21 of layer 19. In this instance, the single crystal section 21 is formed by the same growth process forming the fill plug 68. At the conclusion of the growth process, the single crystal section 21 of layer 19 is coextensive with fill plug 68 and projects above the top surface 64a, and the non-single crystal section of layer 19 is coextensive with the single crystal section 21 of layer 19 at the edge 23.

In one embodiment, the process forming the fill plug 68 may use a growth chemistry comprising a dichlorosilane (DCS) and hydrogen chloride (HCl) in a ratio that may be optimized to provide selective epitaxial growth. The HCl may operate as an etchant that inhibits growth on the dielectric layer 64. At the transition at which the formation of layer 19 is to be initiated (i.e., when the growth front for the fill plug 68 reaches the top surface 64a), the flow of HCl in the reactant stream supplied to the process chamber is interrupted, which changes the process from selective epitaxy to non-selective epitaxy. Deposition of the polycrystalline silicon in layer 19 commences on the dielectric layer 64, while single crystal silicon concurrently grows on the fill plug 68 to define the single crystal section 21.

Figure 8:
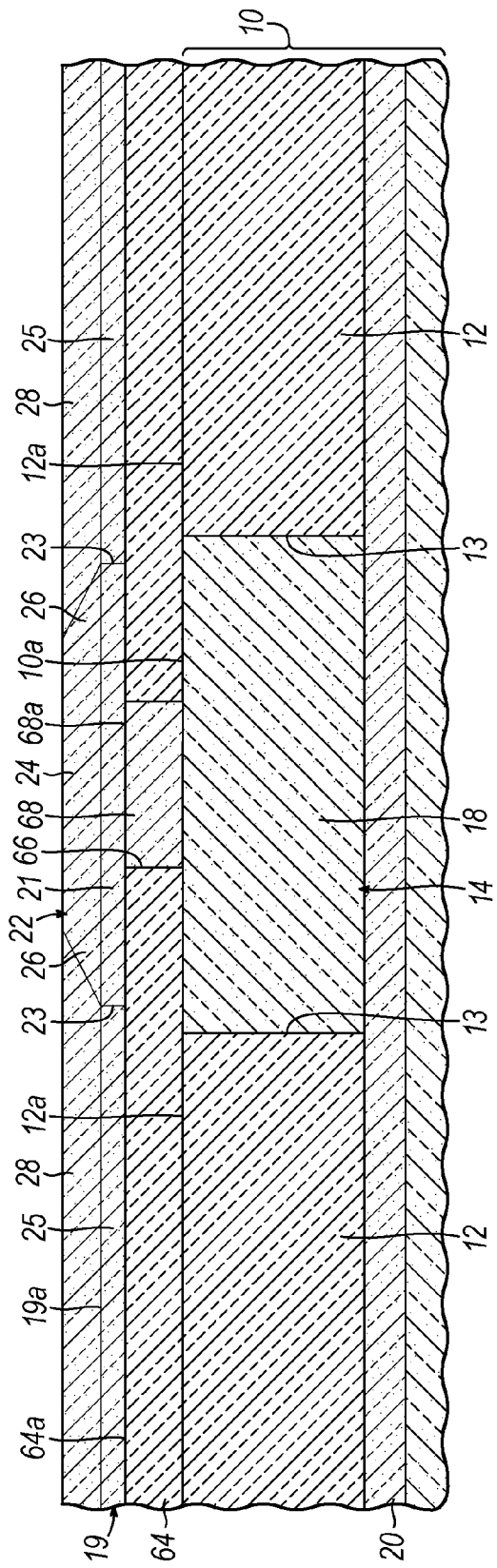

With reference to FIG. 8 in which like reference numerals refer to like features in FIG. 7 and at a subsequent fabrication stage of the processing method, a thermal anneal may be used to laterally extend the edge 23 laterally outward and thereby increase the dimensions of the single crystal section 21 by realigning additional non-single crystal semiconductor material of layer 19. The thermal anneal may be a low temperature anneal at a temperature sufficient to cause realignment. The enlarged single crystal region 21 retains the epitaxial relationship with the semiconductor material of active device region 14 and fill plug 68. In an alternative embodiment, a separate anneal may be omitted if the growth conditions (e.g., growth temperature) of the layer 19 are appropriately selected.

The intrinsic base layer 22 is formed, as described above in connection with FIG. 2. The intrinsic base layer 22 extends laterally so that the facets 26 of the intrinsic base layer 22 nominally coincide with the edge 23 between the single crystal section 21 of layer 19 and sections 25 of layer 19. The sequence of the process flow then continues as described above with regard to FIG. 3 to produce the bipolar junction transistor 50.

Figure 9:
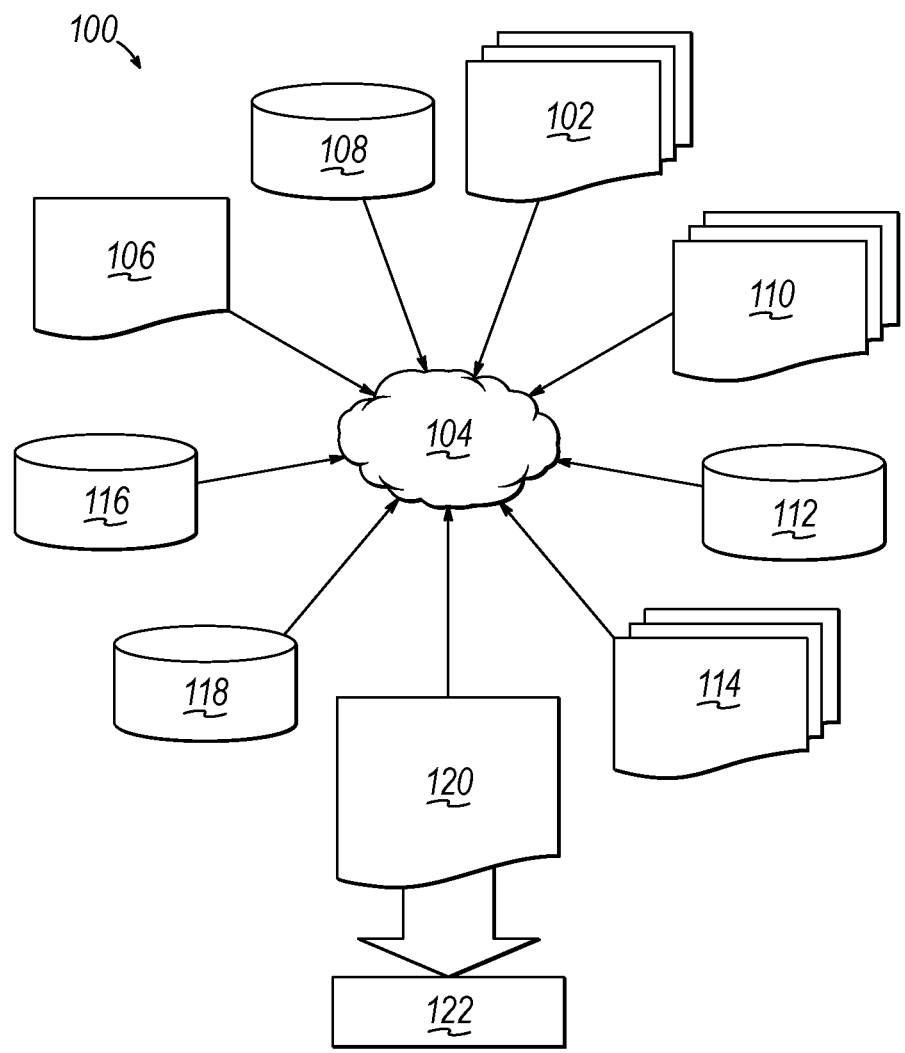
FIG. 9 is a flow diagram of a design process used in semiconductor design, manufacture, and/or test.

FIG. 9 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-8. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-8. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-8 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-8. In one embodiment, design structure 120 may comprise a compiled, executable HDL simulation model that functionally simulates the devices shown in FIGS. 1-8.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-8. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a bipolar junction transistor, the method comprising:
   forming a dielectric structure that is coextensive with a single crystal semiconductor material of a substrate in an active device region;
   depositing a semiconductor layer comprised of a non-single crystal semiconductor material on the active device region and on the dielectric structure;
   annealing the semiconductor layer to realign the non-single crystal semiconductor material and thereby form a single crystal section on the active device region and having an edge that overlaps with a top surface of the dielectric structure; and
   after the semiconductor layer is annealed, forming an intrinsic base layer on the semiconductor layer.

2. The method of claim 1 wherein the intrinsic base layer is coterminous with the semiconductor layer.

3. The method of claim 1 wherein the intrinsic base layer includes a single crystal section coextensive with the single crystal section of the semiconductor layer and a facet coterminous with the edge of the single crystal section.

4. The method of claim 1 further comprising:
   forming a collector in the active device region; and
   forming an emitter coupled by the intrinsic base layer with the collector.

5. The method of claim 1 wherein the dielectric structure is a trench isolation region in the substrate and defining a boundary of the active device region, and the single crystal section of the semiconductor layer extends laterally beyond the boundary so that the edge of the single crystal section overlies the trench isolation region.

6. The method of claim 1 wherein the active device region acts as a growth seed for the single crystal section, the semiconductor layer includes a non-single crystal section on the top surface of the dielectric structure, and the edge is disposed between the single crystal section and the non-single crystal section.

7. The method of claim 6 further comprising:
   before the semiconductor layer is annealed, patterning the semiconductor layer to remove a field section of the semiconductor layer peripherally outside of the active device region.

8. The method of claim 1 wherein the dielectric structure is a dielectric layer, and forming the dielectric structure that is coextensive with the active device region comprises:
   before the semiconductor layer is deposited, forming the dielectric layer on a top surface of the active device region;
   forming an opening in the dielectric layer that extends vertically to the active device region; and
   forming a plug of a semiconductor material in the opening that has an epitaxial relationship with the single crystal semiconductor material of the substrate in the active device region.

9. The method of claim 8 further comprising:
   before the dielectric layer is formed, forming a trench isolation region in the substrate to define a boundary in the substrate for the active device region,
   wherein the dielectric layer is located between the trench isolation region and the semiconductor layer.

10. The method of claim 8 wherein the plug acts as a growth seed for the single crystal section.

11. The method of claim 8 wherein the plug is grown using a selective epitaxial growth process, and the semiconductor layer is formed using an epitaxial growth process that forms the single crystal section in an epitaxial relationship with the plug and a non-single crystal section on the top surface of the dielectric layer, and the edge is disposed between the single crystal section and the non-single crystal section.

12. The method of claim 1 wherein the intrinsic base layer is formed on the semiconductor layer using a low temperature epitaxial (LTE) growth process.

13. The method of claim 9 wherein the single crystal section of the semiconductor layer extends laterally beyond the boundary so that the edge of the single crystal region overlies the trench isolation region.

14. The method of claim 1 wherein the semiconductor layer is directly on the active device region.

15. The method of claim 5 wherein the semiconductor layer is directly on the active device region and directly on the trench isolation region.

16. The method of claim 8 wherein the semiconductor layer is directly on the plug and directly on the dielectric layer.

* * * * *